United States Patent [19]

Barrell et al.

[11] 4,446,173

[45] May 1, 1984

[54] COPPER-CLAD POLYESTER-GLASS FIBER LAMINATES USING ZINC-COATED COPPER

[75] Inventors: David Barrell, Temple City; Donald E. Kennedy, Baldwin Park; James J. Marino, Jr., Monrovia; Donald C. Rollen, Railto, all of Calif.

[73] Assignee: Glasteel Tennessee, Inc., Duarte, Calif.

[21] Appl. No.: 349,676

[22] Filed: Feb. 17, 1982

Related U.S. Application Data

[63] Continuation-in-part of Ser. No. 291,929, Aug. 11, 1981.

[51] Int. Cl.³ .................. B32B 15/00; B05D 1/14
[52] U.S. Cl. .................... 427/206; 427/369; 427/388.1; 427/433; 427/436; 428/480; 428/433; 428/288; 428/458
[58] Field of Search ............... 427/433, 436, 206, 369, 427/388.1; 428/433, 430, 458, 480, 375, 288

[56] References Cited

U.S. PATENT DOCUMENTS

| | | |
|---|---|---|
| 3,149,021 | 9/1964 | Geopfest . |
| 3,477,900 | 11/1969 | Soukup et al. . |
| 3,700,538 | 10/1972 | Kennedy .................... 428/241 |
| 3,729,294 | 4/1973 | Hibbs .......................... 428/381 |
| 4,093,768 | 6/1978 | Cordts ......................... 428/458 |
| 4,272,570 | 6/1981 | Narayan ...................... 427/436 |

FOREIGN PATENT DOCUMENTS 54-103567  8/1979  Japan ............................ 428/458

Primary Examiner—George F. Lesmes
Assistant Examiner—E. Rollins Buffalow
Attorney, Agent, or Firm—Lyon & Lyon

[57] ABSTRACT

A metal foil laminate including at least one sheet of metal foil directly bonded to one face of a sheet of glass fiber reinforced polyester resin, and a continuous process for preparing such laminates.

23 Claims, 2 Drawing Figures

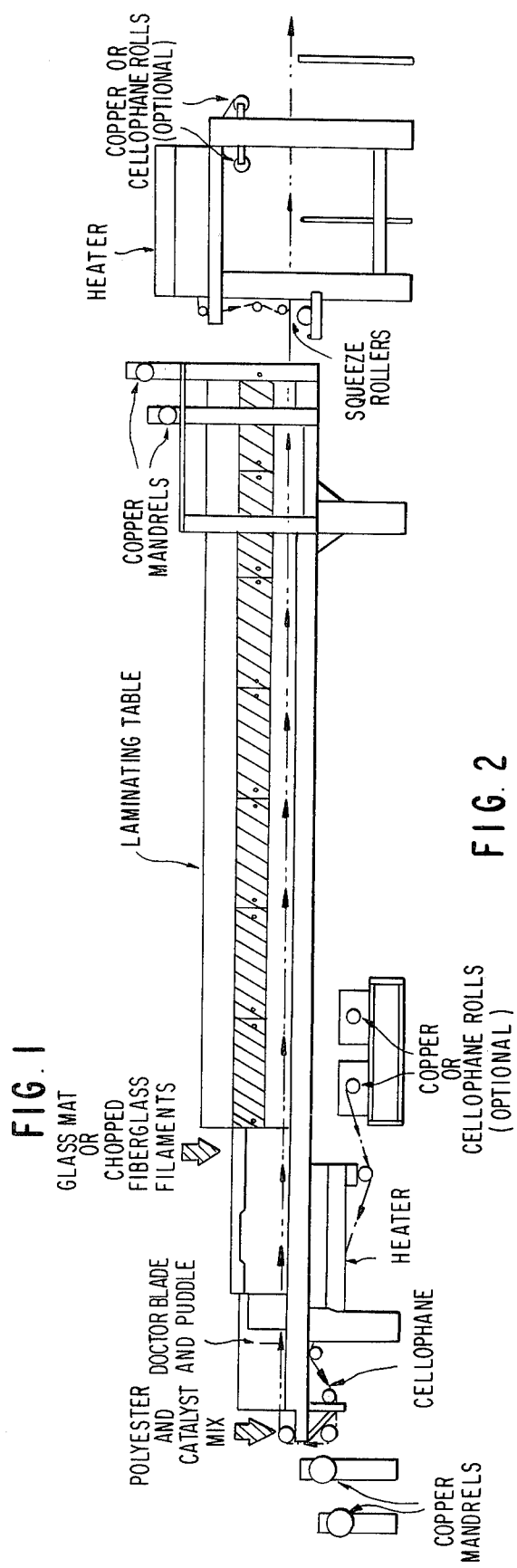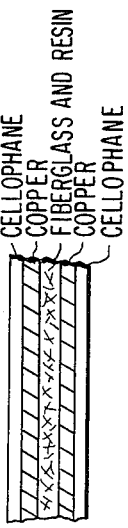

4,446,173

COPPER-CLAD POLYESTER-GLASS FIBER LAMINATES USING ZINC-COATED COPPER

RELATED APPLICATION

This application is a continuation-in-part of our earlier application Ser. No. 291,929, filed Aug. 11, 1981, the entire disclosure of which is incorporated herein by references.

BACKGROUND OF THE INVENTION

The invention relates to laminates of reinforced polyester bonded to metal sheets.

Electrical circuit boards are prepared by laminating metal sheets, e.g. copper sheets, with sheets of electrical insulating materials, such as glass fiber reinforced unsaturated polyester resin sheets. Such electrical circuit boards may be either rigid or flexible, and are further classified as single-sided (metal foil on one side of the insulating material only), double-sided (metal foil on both sides of the insulating material), or multi-layered.

The electrical insulating material is a base or support for the metal sheets bonded thereto. The National Electrical Manufacturers Association (NEMA) has established standards for various base materials. Standards for polyester glass-mat sheet laminates have been established by NEMA, viz. Grades GPO-1, GPO-2, and GPO-3.

Normally the metal foil, usually copper foil, is secured to the reinforced plastic sheet by means of a suitable adhesive. For example, U.S. Pat. No. 3,700,538 discloses adhesive bonding copper foil to resin-impregnated fiberglass cloth using polyimide resin adhesive. It is also known to add an adhesion promoter to the insulating base material. For example, U.S. Pat. Nos. 3,477,900 and 3,149,201, disclose that when the insulating base material comprises methylmethacrylate resin, then unsaturated polyester may be added to the resin as an adhesion promoter to bond a copper foil. However, these patents disclose an increase in the proportion of polyester is generally accompanied by a decrease in adhesion of the copper foil to the resinous base. As the proportion of polyester is increased beyond 45 parts by weight, per 100 parts of methylmethacrylate resin, the adhesion falls rapidly to an unacceptable value. U.S. Pat. No. 4,093,768 discloses that unsaturated polyester resin containing up to about 2% by weight of benzotriazole, incorporated into the resin as an adhesion promoter, can be bonded under pressure directly on a copper foil.

Alternatively, treatment of the surface of the metal foil has been suggested to promote adhesion. U.S. Pat. No. 3,674,445 discloses that a tightly adherent organic coating can be provided on a copper surface by interposing a vacuum vapor deposited zinc coating between the copper surface and the organic coating. U.S. Pat. No. 3,729,294 describes a method of promoting adhesion of a polymer insulating coating to a copper surface by forming a thin film of zinc on the surface and heating the surface to diffuse the zinc therein, to obtain a zinc-diffused surface having the golden appearance of brass. As can be seen, these prior methods are generally complex and therefore expensive to practice.

SUMMARY OF THE INVENTION

The invention provides an economical continuous process for bonding an unsaturated polyester resin to a metal foil, such as a copper foil. A uniform layer of catalyst-containing polyester resin, optionally containing an adhesion promoter, is applied to a copper foil. Chopped glass fibers are randomly distributed into the resin layer, and the laminate is subjected to a heat treatment to initiate gelation. Alternately, a glass fiber mat is applied onto the resin layer, and the laminate is subjected to a heat treatment to initiate gelation. A second copper foil may be applied to the partially gelled resin. The laminate is thereafter cured in a multi-zone heat treatment.

The process of the invention provides laminates of fiber glass reinforced polyester bonded to copper. These laminates are useful as electrical circuit boards.

BRIEF DESCRIPTION OF THE DRAWINGS

FIG. 1 is a schematic illustration of the process of the present invention;

FIG. 2 is a schematic illustration of a copper-clad polyester-glass fiber laminate according to the present invention, including optional cellophane carrier sheets.

DETAILED DESCRIPTION OF THE INVENTION

The present invention provides an economical continuous process for manufacturing copper-clad polyester-glass fiber laminates, which are useful as electrical circuit boards. Electrical circuit boards employ a copper, or other metal, foil which is subsequently etched away to leave behind portions of the copper foil as electrical conductors. The copper foil thickness is customarily measured in terms of the number of ounces of copper per square foot of the foil. Electrodeposited foil is generally used in the manufacture of electrical circuit board. Electrodeposited foil is produced by plating from stainless steel drum, from which the copper foil is continuously stripped. The inner surface of the resulting foil exhibits a smooth finish, whereas the outer surface is coarse, thereby promoting improved bonding with the increased surface area. In the improved process of the present invention, this coarse surface of the copper foil is zinc coated. The thickness of the foil is controlled by adjusting the solution concentration and the electrical and mechanical parameters of the plating process. Generally, electrical circuit boards employ copper foil of one or two ounces per square foot thickness. Foils of one ounce per square foot have an approximate thickness of 0.0014 inch (0.0036 cm) whereas two ounce foils have an approximate thickness of 0.0028 inch (0.0071 cm). The zinc coating applied to the coarse surface of the copper foil is preferably an electrogalvanized coating, and is typically from about 6 to about 10 microinches thick.

The copper foil used in the process of the present invention meets the standard developed by the "Institute for Interconnecting and Packaging Electronic Circuits", standard IPC-CF-150E, incorporated herein by reference. The copper foil may be heated before a coating of catalyzed polyester resin is applied. Preheating the zinc-coated copper foil helps to avoid wrinkles and other surface imperfections which might interfere with adhesion of the zinc-coated copper foil to the polyester resin. It is also believed that heating the zinc-coated copper foil makes the zinc-coated foil surface more receptive to adhesion to polyester resin, although the mechanism of this effect is not known.

If desired, a cellophane carrier sheet may be used to support the zinc-coated copper foil. Plain transparent cellophane is suitable for this purpose. Cellophane made from polyethyleneterephthalate may also be used. In general, cellophane ranging from about 48 to about 174 gauge (about 0.12 to about 0.44 cm) may be used. In general, the heavier the copper foil used, the thicker the cellophane carrier sheet should be to minimize stress.

The unsaturated polyester resin used may generally be described as a linear polyester resin capable of cross-linking with vinyl monomers to form thermoset copolymers. Polyester resins comprising phthalic anhydride, maleic anhydride, propylene glycol, ethylene glycol, and styrene are suitable in the process and product of the present invention. Although the process of the present invention is primarily directed toward making rigid electrical circuit boards, the present invention also contemplates the preparation of flexible electrical circuit boards using the present process. To prepare flexible electrical circuit boards, a flexible unsaturated polyester resin is used. Typical flexible unsaturated polyester resins comprise phthalic anhydride, maleic anhydride and diethylene glycol ($HOCH_2CH_2OCH_2CH_2OH$).

The unsaturated polyester resin used in the process of the present invention contains a catalyst to promote cross-linking or thermoset structure. The primary consideration in selecting a catalyst is generally the temperature at which the curing process is to be carried out. For any given resin-catalyst system there is an optimum temperature at which the resin can utilize all of the free radicals formed by the catalyst decomposition at that temperature. Above that temperature, peroxide is wasted and below it too much time is required to complete cure. Catalyst useful in the process of the present invention include peroxides such as benzoyl peroxide or methyl ethyl ketone peroxide, or hydroperoxide such as cumene hydroperoxide, or other compounds which decompose to form active free radicals, such as t-butyl perbenzoate. In the process of the present invention, the amount of catalyst used is sufficient to achieve gelation in a time from about 1.5 minutes to about 4 minutes, and to achieve the exothermic stage of curing in a time from about 5 to about 8 minutes. This time interval (to achieve the exothermic curing stage) does not indicate the completion of the cure, but merely that the heat being generated by the curing reaction has reached a maximum.

Fire retardants such as bromine-containing compounds may be added to the polyester resin and catalyst.

If desired, fillers may also be added to the polyester resin and catalyst. Typical fillers include Georgia kaolin, fused silica, alumina trihydrate, and nepheline. The use of such fillers may improve the physical properties of the final laminate, including both mechanical and electrical properties. The amount of filler used may vary from about 5 to about 50 parts by weight, per 100 parts by weight of resin.

Glass fibers are used to reinforce the polyester resins in the process of the present invention. In one embodiment, chopped glass fiber strands are randomly distributed into the resin layer as a reinforcing agent. In an alternate embodiment, a mat of glass fibers is applied to the resin at the same location, instead of chopped glass fiber strands. Glass is particularly useful as a reinforcing agent because of its high tensile strength, high modulus of elasticity, ability to be formed to small diameter fibers, inertness, and low specific gravity compared to equally strong fibers. In the embodiment of the present invention using chopped glass, glass fiber strands are chopped into filaments about two inches long, and randomly distributed into the polyester resin layer. In the embodiment of the present invention using a glass mat, a mat of electrical grade glass fibers weighing from about ¾ ounce to about 12 ounces per square foot is uniformly applied to the polyester resin layer. In general, in the process of the present invention, the weight of glass fiber filaments distributed into the polyester resin is from about 10% to about 30% by weight compared to the resin, preferably from 10% to about 20% by weight compared to the resin, and most preferably from about 12% to about 15% by weight compared to the resin.

Referring to FIG. 1, in the process of the present invention a zinc-coated copper (or other metal) foil, optionally carried on a cellophane sheet (not shown), is coated with a polyester resin mixture containing catalyst. A coating of polyester resin and catalyst is uniformly applied to the sheet of zinc-coated metal foil using a doctor blade set to form a puddle. A mat of glass fibers or chopped strands of fiber glass rope is then uniformly distributed across the polyester resin layer carried on the zinc-coated metal foil. The polyester resin coated metal foil then enters a Laminating Table, where a uniform temperature is maintained, which may be adjusted from about 50° F. (10° C.) to about 200° F. (93° C.). The temperature in the Laminating Table is preferably maintained between about 100° F. (38° C.) to about 200° F. (93° C.). The heat in the Laminating Table initiates gelation. In the process of the present invention, the polyester resin coated metal foil preferably moves through the Laminating Table at a speed from about 10 to about 65 feet/min. (about 3 to about 20 meters/min.) and preferably at a speed between about 20 to about 35 feet/min. (about 6 to about 11 meters/min.).

Again referring to FIG. 1, a second zinc-coated metal foil may be applied to the partially gelled polyester resin coated metal foil, leaving the Laminating Table and entering the Squeeze Rolls. As can be seen in FIG. 1, a zinc-coated metal foil sheet, such as a zinc-coated copper foil sheet, passes through a heater, where it is optionally heated to promote adhesion, as discussed above. Again, the zinc-coated metal foil may be supported by a cellophane carrier sheet, if desired. An important feature of the process of the present invention are the Squeeze Rolls shown at the point where the second metal foil meets the partially gelled polyester resin. The squeeze rolls are to be adjusted for the final thickness of the laminate product, and may be adjusted to insure that a puddle of polyester resin forms at this point on the line. That is, the amount of polyester resin permitted through the doctor blade at the beginning of the line is greater than the amount of polyester resin which is permitted to pass between the squeeze rolls when a second zinc-coated metal foil is used. The puddle of polyester resin which forms at this point is important, because it coats the second zinc-coated metal foil sheet before the second sheet touches the partially gelled polyester resin coating on the first metal foil. Coating the second zinc-coated metal sheet with polyester resin before it contacts the polyester resin coating on the first zinc-coated metal foil heats the second zinc-coated metal sheet to the temperature of the polyester resin coating on the first sheet. Thus, this aspect of the process of the present invention both eliminates air bubbles and other imperfections which would interfere with the formation of a strong bond between the second metal foil and the partially gelled polyester resin coating. Of course, it will be understood that if a single-sided product, containing a metal foil on one side of the polyester material only, is desired, the second metal foil can be omitted from the process of the present invention. The squeeze rolls apply pressure to the laminate to promote bonding both in the case of a single-sided product, and in the case of a double-sided product. In the process of the present invention, the squeeze rolls are generally set between about 0.010 to about 0.125 inch (about 0.025 to 0.318 cm). In the case of a double-sided product, the squeeze rolls are generally set between about 0.060 to about 0.125 inch (about 0.152 to 0.318 cm).

The laminate is thereafter cured in a multi-zone heat treatment. The oven zones are set up as follows:

(1) Preheat section: from about 250° to 350° F. (about 120° to 175° C.) to bring the laminate up to cure temperature quickly;

(2) Gelation section: in the range from about 100° to 350° F. (about 38° to 175° C.). Temperature control in this zone must be carefully controlled to avoid runaway of the curing reaction;

(3) Exotherm section: usually no heat is supplied since the curing resin is reaching its maximum temperature in this zone; and (4) Finish off-section: in the range from about 300° to about 500° F. (about 150° to 260° C.) to finish off curing the laminate.

After curing, the laminate is edge-trimmed to produce the desired width. Cellophane carrier sheets, if used, are also removed from the laminate after curing. Trimming is accomplished by shearing. When shearing single-sided copper-clad laminate into smaller blanks, the foil side should face upward with the polyester base material against the shear table. By cutting through the foil side first, there is less tendency to tear the foil away from the edge of the blank.

FIG. 2 illustrates a laminate product produced by the process of the present invention. A double-sided product is illustrated, with cellophane carrier sheets. As noted above, the cellophane carrier sheets are removed from the laminate after curing.

Although the process of the present invention is particularly useful for bonding zinc-coated copper foil to a polyester resin base for manufacturing an electrical circuit board, it is believed that other metals may be employed in the process of the present invention. For less costly printed circuit boards, zinc-coated aluminum foil may be substituted for the zinc-coated copper foil in the process of the present invention. Zinc-coated silver or gold foil may also be utilized for special purposes, and zinc-coated tantalum or titanium for resistant circuits. In addition to electrical circuit boards, the process of the present invention may be used to produce structural laminates, for example, by bonding a zinc-coated aluminum foil to a corrugated polyester resin base.

As used in this specification, an "electrogalvanized" zinc-coating means an electroplated zinc coating, plated directly on the metal substrate (e.g., copper) containing about 500 to about 1500 micrograms of zinc per square inch of coating.

It is understood that various other modifications will be apparent to and can readily be made by those skilled in the art without departing from the scope and spirit of this invention. Accordingly, it is not intended that the scope of the claims appended hereto be limited to the description set forth above, or the following examples, but rather that the claims be construed as encompassing all the features of patentable novelty which reside in the present invention, including all features which would be treated as equivalents thereof by those skilled in the art to which the invention pertains.

EXAMPLES

Using the process illustrated in FIG. 1, a one ounce copper foil, 39 inches wide, sold by Yates Industries, Inc., Beaumont, Calif. (Extra Heavy Zinc treated copper foil) was used to prepare a double-sided electrical circuit board. The same process was also used to prepare a single-sided electrical circuit board. The polyester resin, containing 0.1% by weight of cellulose acetate butyrate, was manufactured by Alpha Resins, a division of the Alpha Corporation of Collierville, Tennessee (Alpha polyester resin 59-60101). A catalyst was incorporated into the polyester resin in the following manner. To 200 lbs. of polyester resin, the catalyst system included 2 lbs. of cumene hydroperoxide, 0.4 lbs. of benzotrimethylammonium chloride, and 0.1 lbs. of a 16% by weight solution of zinc (Zinc 16 brand by Tenneco Corporation).

The first (bottom) copper foil was supported by a plain transparent cellophane sheet of 174 gauge. The catalyst-containing polyester resin was poured on the copper foil at a rate sufficient to form a puddle to insure a uniform coating. The doctor blade was set at 0.105 inch (0.267 cm). Moving at a line speed of about 22 ft./min. (about 6.70 meters/min.), a glass mat amounting to 14% by weight, compared to the weight of the polyester resin, was uniformly distributed onto the polyester resin layer. The laminating table was operated at a temperature of 175° F. (80° C.). A second (top) copper foil was applied to the partially gelled resin. The second copper foil was of the same material as the first copper foil, and was supported on a plain transparent cellophane carrier of 48 gauge. The glass mat weighed 1.5 ounces per square foot (Certainteed M113 glass mat).

The squeeze rolls were set at 0.068 inch (0.17 cm) and the curing zones were set at 300° F. (149° C.) in the preheat section, 250° F. (121° C.) in the gelation section and 400° F. (204° C.) in the finish-off section. The thickness of the double-sided product was 0.062 inch (0.16 cm).

The process of the above example was repeated using 25% by weight, compared to the resin, of Georgia kaolin filler. Superior mechanical properties were obtained.

Three products prepared according to this example (without using filler) were subjected to the Peel Strength test described in NEMA publication LI 1, paragraphs 10.13 and 10.14 (solder Float Test). The following peel strengths were obtained (in pounds per inch width):

| Specimen | Lengthwide Peel Strength | Crosswise Peel Strength |
|---|---|---|
| Topside | | |
| 1 | 7.8 | 7.1 |
| Bottom Side | | |
| 1. | 8.4 | 8.0 |
| 2. | 8.6 | 8.4 |
| 3. | 8.1 | 7.8 |

What is claimed is:

1. A continuous process for preparing a metal foil laminate having at least one sheet of an electrogalvanized zinc-coated metal foil directly bonded to a face of a sheet of a glass fiber reinforced linear polyester resin, comprising:

applying a coating of a polyester resin to a first electrogalvanized zinc-coated metal foil, selected from the group consisting of copper foil, aluminum foil, silver foil, gold foil, tantalum foil, and titanium foil, uniformly distributing a glass mat on said linear polyester resin coating, heating said glass fiber containing linear polyester resin coated metal foil to partially gel said resin, applying pressure to said partially gelled linear polyester resin coated metal foil, and curing said linear polyester resin.

2. A continuous process for preparing a metal foil laminate as set forth in claim 1, including applying a second electrogalvanized zinc-coated metal foil to said partially gelled linear polyester resin coating on said first electrogalvanized zinc-coated metal foil immediately after heating said glass fiber containing linear polyester resin coated first metal foil.

3. A metal foil laminate having at least one sheet of electrogalvanized zinc-coated metal foil directly bonded to a face of a sheet of a glass fiber reinforced linear polyester resin, prepared by the process of claim 1.

4. A metal foil laminate having two sheets of electrogalvanized zinc-coated metal foil directly bonded to opposite faces of a sheet of glass fiber reinforced linear polyester resin, prepared by the process of claim 2.

5. A continuous process for preparing a metal foil laminate as set forth in claim 1, wherein said metal foil laminate consists of one sheet of electrogalvanized zinc-coated foil directly bonded to one face of a sheet of glass fiber reinforced linear polyester resin.

6. A continuous process for preparing a metal foil laminate as set forth in claim 1, wherein said sheet of cured glass fiber reinforced linear polyester resin is rigid.

7. A continuous process for preparing a metal foil laminate as set forth in claim 1, wherein said sheet of cured glass fiber reinforced linear polyester resin is flexible.

8. A continuous process for preparing a metal foil laminate as set forth in claim 6, wherein said metal foil is electrogalvanized zinc-coated copper foil.

9. A continuous process for preparing a metal foil laminate as set forth in claim 7, wherein said metal foil is electrogalvanized zinc-coated copper foil.

10. A continuous process for preparing a metal foil laminate as set forth in claim 8, wherein said electrogalvanized zinc-coated copper foil has a weight of one ounce per square foot.

11. A continuous process for preparing a metal foil laminate as set forth in claim 9, wherein said electrogalvanized zinc-coated copper foil has a weight of one ounce per square foot.

12. A continuous process for preparing a metal foil laminate as set forth in claim 6, wherein said linear polyester resin comprises phthalic anhydride, maleic anhydride, propylene glycol, ethylene glycol, and styrene.

13. A continuous process for preparing a metal foil laminate as set forth in claim 7, wherein said linear polyester resin comprises phthalic anhydride, maleic anhydride, and diethylene glycol.

14. A continuous process for preparing a metal foil laminate as set forth in claim 6, wherein said linear polyester resin includes a catalyst selected from the group consisting of peroxide and hydroperoxides.

15. A continuous process for preparing a metal foil laminate as set forth in claim 14, wherein said catalyst is a hydroperoxide.

16. A continuous process for preparing a metal foil laminate as set forth in claim 15, wherein said catalyst is cumene hydroperoxide.

17. A continuous process for preparing a metal foil laminate as set forth in claim 14, wherein said sheet of cured glass fiber reinforced linear polyester resin includes about 10% to 30% by weight, compared to the resin, glass fiber, and wherein said electrogalvanized zinc-coated foil is bonded to the resin face.

18. A continuous process for preparing a metal foil laminate as set forth in claim 17, wherein said glass fiber is randomly distributed in said linear polyester resin.

19. A continuous process for preparing a metal foil laminate as set forth in claim 1, wherein said metal foil is electrogalvanized zinc-coated aluminum foil.

20. A continuous process for preparing a metal foil laminate as set forth in claim 1, wherein said metal foil is electrogalvanized zinc-coated silver foil.

21. A continuous process for preparing a metal foil laminate as set forth in claim 1, wherein said metal foil is electrogalvanized zinc-coated gold foil.

22. A continuous process for preparing a metal foil laminate as set forth in claim 1, wherein said metal foil is electrogalvanized zinc-coated tantalum foil.

23. A continuous process for preparing a metal foil laminate as set forth in claim 1, wherein said metal foil is electrogalvanized zinc-coated titanium foil.

* * * * *